United States Patent
Liaw

(10) Patent No.: US 9,911,727 B2
(45) Date of Patent: Mar. 6, 2018

(54) STRAPPING STRUCTURE OF MEMORY CIRCUIT

(71) Applicant: TAIWAN SEMICONDUCTOR MANUFACTURING COMPANY, LTD., Hsinchu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 3 days.

(21) Appl. No.: 14/723,615

(22) Filed: May 28, 2015

(65) Prior Publication Data

US 2016/0276331 A1 Sep. 22, 2016

Related U.S. Application Data

(60) Provisional application No. 62/133,928, filed on Mar. 16, 2015.

(51) Int. Cl.
  *G11C 5/06* (2006.01)
  *H01L 27/02* (2006.01)
  *H01L 27/112* (2006.01)

(52) U.S. Cl.
  CPC ...... *H01L 27/0207* (2013.01); *H01L 27/1124* (2013.01)

(58) Field of Classification Search
  CPC .......... H01L 27/0207; H01L 27/1124
  See application file for complete search history.

(56) References Cited

U.S. PATENT DOCUMENTS

| 7,920,403 | B2 | 4/2011 | Liaw |
| 8,212,295 | B2 | 7/2012 | Liaw |
| 8,421,205 | B2 | 4/2013 | Yang |
| 8,661,389 | B2 | 2/2014 | Chern et al. |
| 8,698,205 | B2 | 4/2014 | Tzeng et al. |
| 8,826,212 | B2 | 9/2014 | Yeh et al. |
| 8,836,141 | B2 | 9/2014 | Chi et al. |
| 2003/0095429 | A1 | 5/2003 | Hirose et al. |
| 2005/0062062 | A1 | 3/2005 | Bertin et al. |
| 2005/0247981 | A1 | 11/2005 | Wang |
| 2006/0091468 | A1 | 5/2006 | Liaw |

(Continued)

FOREIGN PATENT DOCUMENTS

KR 20130111144 A 10/2013

*Primary Examiner* — Mohammed A Bashar
(74) *Attorney, Agent, or Firm* — Slater Matsil, LLP

(57) ABSTRACT

A memory circuit includes a first memory cell and a second memory adjacent to the first memory cell. The first memory cell includes a first word line strapping line segment electrically coupled with a pass device of the first memory cell; and a second word line strapping line segment. The second memory cell includes a first word line strapping line segment; and a second word line strapping line segment electrically coupled with a pass device of the second memory cell. The first word line strapping line segment of the first memory cell and the first word line strapping line segment of the second memory cell are connected with each other at a first interconnection layer. The second word line strapping line segment of the first memory cell and the second word line strapping line segment of the second memory cell are connected with each other at the first interconnection layer.

20 Claims, 9 Drawing Sheets

(56) References Cited

U.S. PATENT DOCUMENTS

| | | |
|---|---|---|
| 2007/0018256 A1 | 1/2007 | Sumimoto et al. |
| 2007/0076491 A1 | 4/2007 | Cherukuri |
| 2008/0003810 A1 | 1/2008 | Lee et al. |
| 2008/0080246 A1 | 4/2008 | Kim |
| 2010/0203672 A1* | 8/2010 | Eun .................... H01L 27/2409 438/102 |
| 2013/0242633 A1 | 9/2013 | Liaw |
| 2013/0258749 A1 | 10/2013 | Liaw |
| 2014/0215420 A1 | 7/2014 | Lin et al. |
| 2014/0264924 A1 | 9/2014 | Yu et al. |
| 2014/0282289 A1 | 9/2014 | Hsu et al. |
| 2014/0325466 A1 | 10/2014 | Ke et al. |

* cited by examiner

STRAPPING STRUCTURE OF MEMORY CIRCUIT

PRIORITY CLAIM

The present application claims priority to U.S. Provisional Patent Application No. 62/133,928, filed Mar. 16, 2015. The entire contents of the above-referenced application is incorporated by reference herein.

RELATED APPLICATIONS

The present application is related to U.S. patent application titled "ROM CELL CONNECTION STRUCTURE," filed on Feb. 28, 2008, U.S. application Ser. No. 12/039,711, now U.S. Pat. No. 7,920,403, and U.S. patent application titled "ROM CELL CIRCUIT FOR FINFET DEVICES," filed on Jun. 30, 2010, U.S. application Ser. No. 12/827,406, now U.S. Pat. No. 8,212,295. The entire contents of the above-referenced applications are incorporated by reference herein.

BACKGROUND

The semiconductor integrated circuit (IC) industry has experienced rapid growth. Technological advances in IC materials and design have produced generations of ICs, where each generation has smaller and more complex circuits than the previous generation. In the course of integrated circuit evolution, functional density (i.e., the number of interconnected devices per chip area) has generally increased while geometry size (i.e., the smallest component or line that can be created using a fabrication process) has decreased. In some applications, a memory array includes rows of gate electrodes electrically connecting various rows of pass devices of memory cells of the memory array. When the width of a conductive structure, such as the gate electrode structures in the memory array, becomes smaller, the unit-length resistance of the conductive structure becomes greater. In some applications, a digital signal transmitted on a conductive structure has a longer rising or falling time when the unit-length resistance thereof becomes greater. In some applications, the speed of turning on or off pass devices of different memory cells at different location of the memory array thus varies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
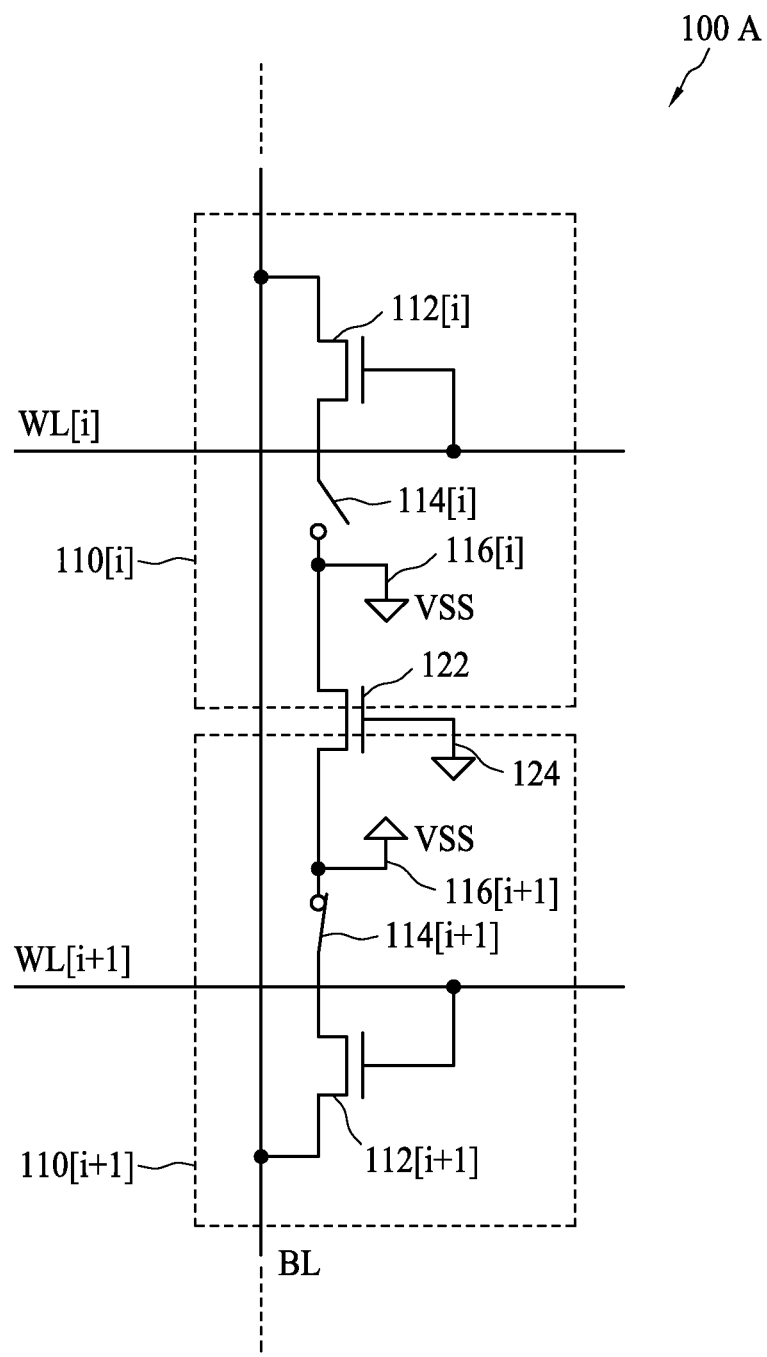
FIG. 1A is a schematic circuit diagram of two read-only memory (ROM) cells in a ROM circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments of the present disclosure, two adjacent read-only memory (ROM) cells of the same row in a ROM circuit share word line strapping structures implemented along the cell boundaries thereof at a first interconnection layer to reduce the equivalent unit-length resistance of the word line structure of the ROM circuit. In accordance with some embodiments of the present disclosure, two adjacent strapping cells of the same column share at least one strapping line at the first interconnection layer.

FIG. 1A is a schematic circuit diagram of two ROM cells 110[i] and 110[i+1] in a ROM circuit 100A in accordance with some embodiments. Index "i" is a positive integer greater than zero.

ROM circuit 100A includes word lines WL[i] and WL[i+1] and a bit line BL. Word line WL[i] is electrically coupled with ROM cell 110[i]; and word line WL[i+1] is electrically coupled with ROM cell 110[i+1]. Bit line BL is electrically coupled with ROM cells 110[i] and 110[i+1]. ROM circuit 100A also includes an isolation device 122 that is shared by and configured to electrically isolate adjacent ROM cells. In some embodiments, ROM circuit 100A includes a plurality of ROM cell pairs having a configuration similar to ROM cells 110[i] and 110[i+1].

ROM cell 110[i] includes a pass device 112[i] and a coding switch 114[i]. Pass device 112[i] is an N-type transistor and also referred to as transistor 112[i]. A drain terminal of transistor 112[i] is electrically coupled with bit line BL. A gate terminal of transistor 112[i] is electrically coupled with word line WL[i]. A source terminal of transistor 112[i] is electrically coupled with coding switch 114[i]. Coding switch 114[i] is disposed between transistor 112[i] and a reference voltage node 116[i]. Coding switch 114[i] is set to be "open" or at a high resistance state to store a predetermined logic value, such as a logic high value. Reference voltage node 116[i] is configured to receive a reference voltage VSS. ROM cell 110[i+1] includes a pass device 112[i+1] implemented by an N-type transistor and a coding switch 114[i+1] coupled with bit line BL, word line WL[i+1], and reference voltage node 116[i+1] in a manner similar to ROM cell 110[i], except coding switch 114[i+1] is set to be "closed" or at a low resistance state to store another predetermined logic value, such as a logic low value.

In some embodiments, coding switches 114[i] and 114[i+1] are implemented by selectively forming or omitting one or more conductive via plugs or conductive lines between bit line BL and the corresponding pass device 112[i] or 112[i+1]. In such a configuration, the logic values stored in ROM cells 110[i] and 110[i+1] are hardwired after fabrication of the ROM circuit 100A. In some embodiments, coding switches 114[i] and 114[i+1] are implemented by e-fuse devices. In such a configuration, the logic values stored in ROM cells 110[i] and 110[i+1] are programmable or one-time programmable after the ROM circuit 100A is fabricated.

Isolation device 122 is configured to electrically isolate coding switches 114[i] and 114[i+1] of corresponding ROM cells 110[i] and 110[i+1]. Isolation device 122 is implemented by an N-type transistor and also referred to as transistor 122. A gate terminal of transistor 122 is electrically coupled with a reference voltage node 124. A first drain/source terminal of transistor 122 is electrically coupled with coding switch 114[i] of ROM cell 110[i]. A second drain/source terminal of transistor 122 is electrically coupled with coding switch 114[i+1] of ROM cell 110[i+1]. Reference voltage node 124 is also configured to receive reference voltage VSS. A voltage level of reference voltage VSS is set to be sufficient to turn off transistor 122.

Figure 1B:
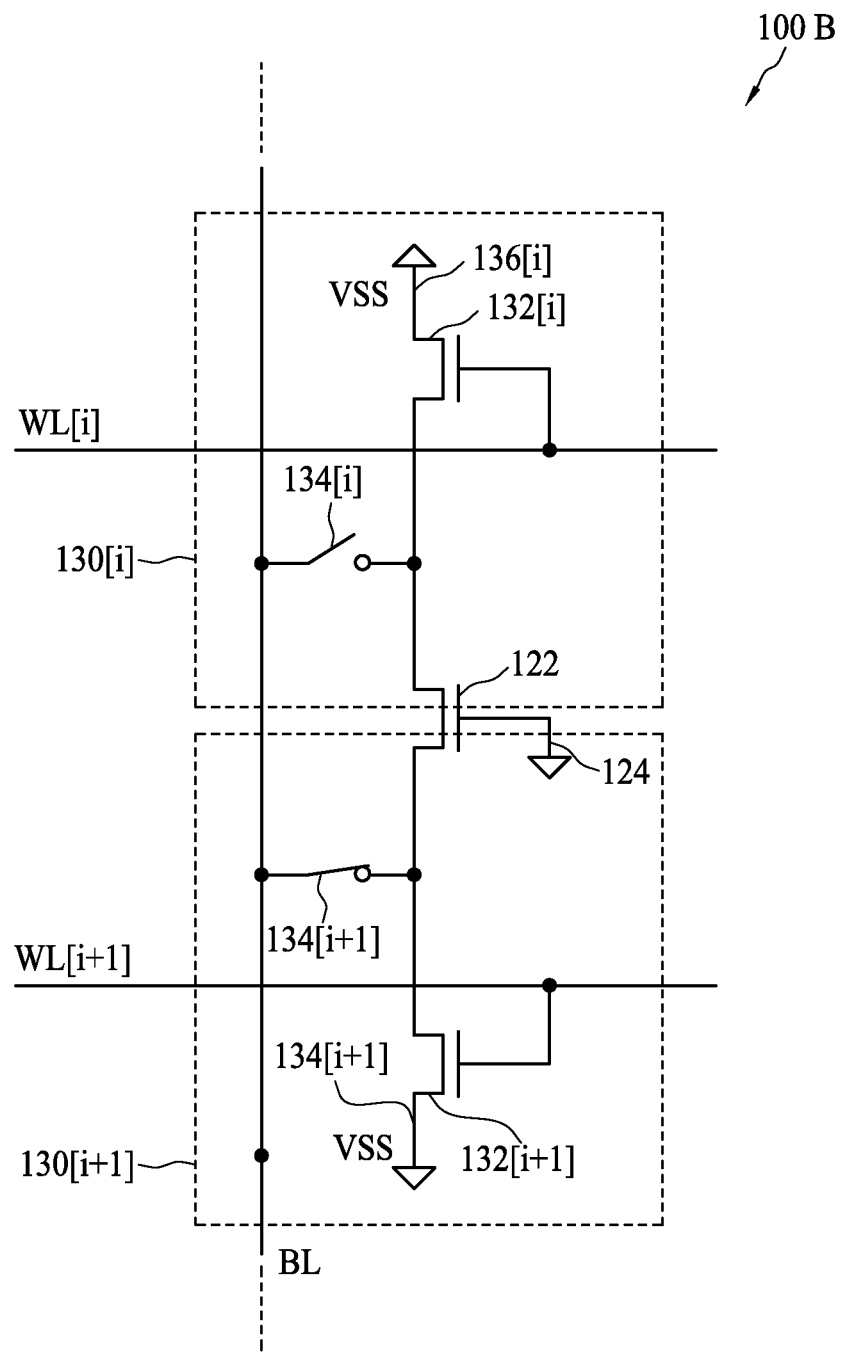
FIG. 1B is a schematic circuit diagram of two read-only memory (ROM) cells in another ROM circuit, in accordance with some embodiments.

FIG. 1B is a schematic circuit diagram of two read-only memory (ROM) cells 130[i] and 130[i+1] in another ROM circuit 100B in accordance with some embodiments. Components of FIG. 1B that are the same or similar to those of FIG. 1A are given the same reference labels, and detailed description thereof is thus omitted.

ROM circuit 100B includes word lines WL[i] and WL[i+1] and a bit line BL. ROM circuit 100B also includes an isolation device 122 configured to electrically isolate adjacent ROM cells. In some embodiments, ROM circuit 100B includes a plurality of ROM cell pairs having a configuration similar to ROM cells 130[i] and 130[i+1].

ROM cell 130[i] includes a pass device 132[i] and a coding switch 134[i]. Pass device 132[i] is an N-type transistor. A drain terminal of transistor 132[i] is electrically coupled with coding switch 134[i]. A gate terminal of transistor 132[i] is electrically coupled with word line WL[i]. A source terminal of transistor 112[i] is electrically coupled with a reference voltage node 136[i]. Reference voltage node 136[i] is configured to receive a reference voltage VSS. Coding switch 134[i] is disposed between transistor 132[i] and bit line BL. Coding switch 114[i] is set to be "open" or at a high resistance state to store a predetermined logic value, such as a logic high value. ROM cell 130[i+1] includes a pass device 132[i+1] implemented by an N-type transistor and a coding switch 134[i+1] coupled with bit line BL, word line WL[i+1], and reference voltage node 136[i+1] in a manner similar to ROM cell 130[i], except coding switch 134[i+1] is set to be "closed" or at a low resistance state to store another predetermined logic value, such as a logic low value.

In some embodiments, coding switches 134[i] and 134[i+1] are implemented by selectively forming or omitting one or more conductive via plugs or conductive lines. In such configuration, the logic values stored in ROM cells 130[i] and 130[i+1] are hardwired after fabrication of the ROM circuit 100B. In some embodiments, coding switches 134[i] and 134[i+1] are implemented by e-fuse devices. In such a configuration, the logic values stored in ROM cells 130[i] and 130[i+1] are programmable or one-time programmable after the ROM circuit 100B is fabricated.

In some embodiments, the layout designs for implementing ROM circuit 100A and ROM circuit 100B are the same at the transistor portion thereof and differ at the via and interconnection layers.

Figure 2A:
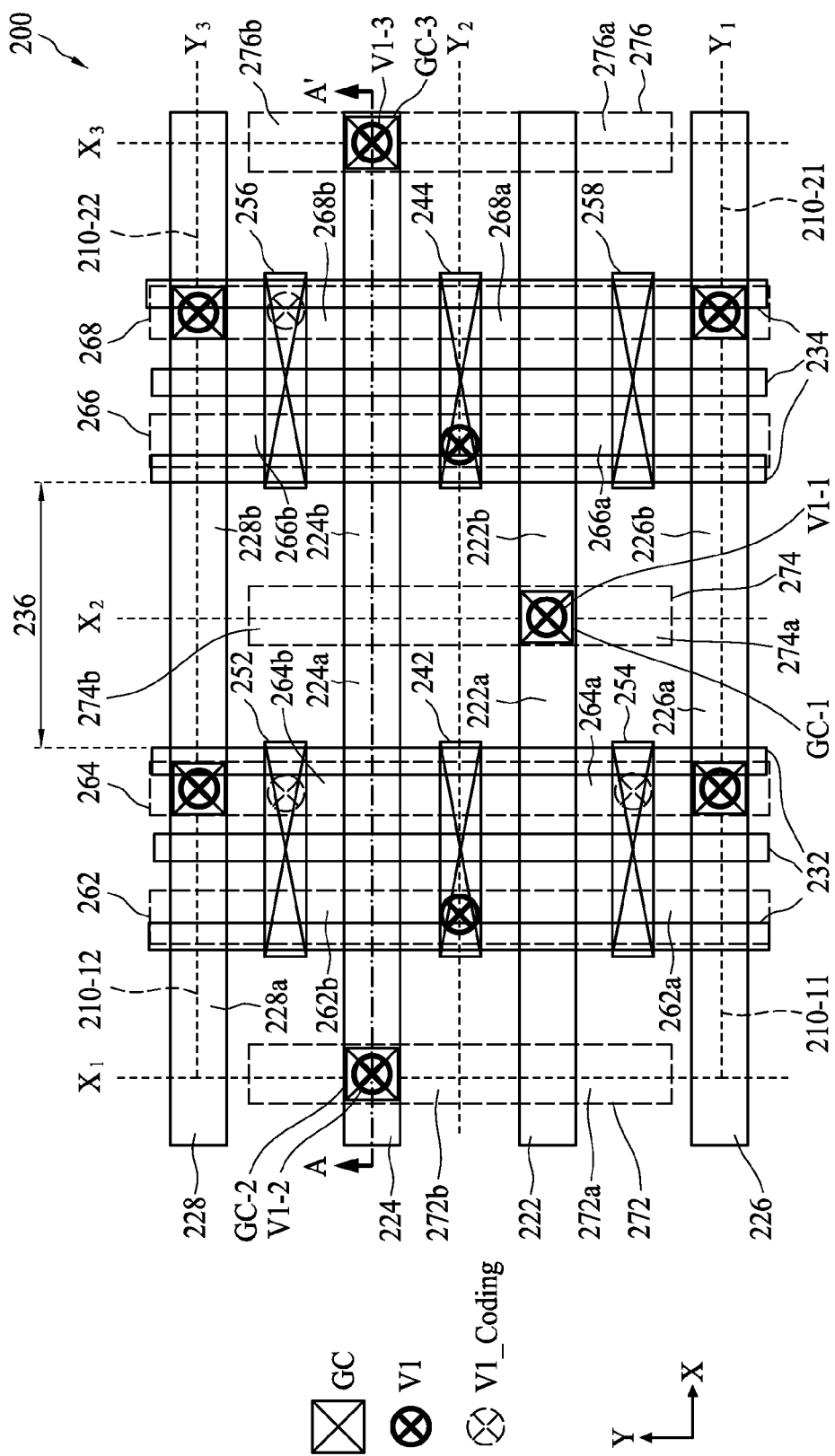
FIG. 2A is a top view of four ROM cells of a ROM circuit based on ROM cells of FIG. 1A, with all the depictions regarding components in and above a second interconnection layer of the ROM circuit omitted, in accordance with some embodiments.

FIG. 2A is a top view of four ROM cells 210-11, 210-12, 210-21, and 210-22 of a ROM circuit 200 based on ROM cells 110[i] and 110[i+1] of FIG. 1A, with all the depictions regarding components in and above a second interconnection layer of the ROM circuit 200 omitted, in accordance with some embodiments. Details regarding the second interconnection layer of the ROM circuit 200 are illustrated in conjunction with FIG. 3.

ROM cells 210-11, 210-12, 210-21, and 210-22 are identified in FIG. 2A by dotted lines representing reference cell boundaries thereof. FIG. 2A also depicts reference lines $X_1$, $X_2$, and $X_3$ extending along a Y direction and reference lines $Y_1$, $Y_2$, and $Y_3$ extending along an X direction. Cell boundaries of ROM cell 210-11 extend along reference line $X_1$, reference line $X_2$, reference line $Y_1$, and reference line $Y_2$. Cell boundaries of ROM cell 210-12 extend along reference line $X_1$, reference line $X_2$, reference line $Y_2$, and reference line $Y_3$. Cell boundaries of ROM cell 210-21 extend along reference line $X_2$, reference line $X_3$, reference line $Y_1$, and reference line $Y_2$. Cell boundaries of ROM cell 210-22 extend along reference line $X_2$, reference line $X_3$, reference line $Y_2$, and reference line $Y_3$.

In some embodiments, a Y direction is also referred to as a column direction of ROM circuit 200, and an X direction is also referred to as a row direction of ROM circuit 200.

ROM circuit 200 includes gate strips 222, 224, 226, and 228 extending along the X direction, fin structures 232 and 234 extending along the Y direction, contact structures 242, 244, 252, 254, 256, and 258 extending along the X direction, and conductive lines 262, 264, 266, 268, 272, 274, and 276 extending along the Y direction. In some embodiments, conductive lines 262, 264, 266, 268, 272, 274, and 276 are in a first interconnection layer of ROM circuit 200. The second interconnection layer is disposed above the first interconnection layer. Details regarding the first interconnection layer of the ROM circuit 200 are illustrated in conjunction with FIG. 3.

ROM circuit 200 also includes various via plugs at a first via plug layer (labeled as V1 or V1_Coding) and gate contact structures GC disposed to electrically connecting various gate strips, contact structures, or conductive lines.

Fin structures 232 and 234 and conductive lines 262, 264, 266, and 268 extend beyond ROM cells 210-11, 210-12, 210-21, and 210-22 and are usable as parts of the ROM cells of ROM circuit 200 that are not depicted in FIG. 2A.

ROM cell 210-11 includes a first gate structure 222a, a second gate structure 226a, a first word line strapping line segment 274a, a second word line strapping line segment 272a, a bit line segment 262a, and a reference voltage line segment 264a. First gate structure 222a is a portion of gate strip 222 that is within an area from reference line $X_1$ to reference line $X_2$. Second gate structure 226a is a portion of gate strip 226 that is within an area from reference line $X_1$ to reference line $X_2$. First word line strapping line segment 274a is a portion of conductive line 274 that is within an area from reference line $Y_1$ to reference line $Y_2$. Second word line strapping line segment 272a is a portion of conductive line 272 that is within an area from reference line $Y_1$ to reference line $Y_2$. Bit line segment 262a is a portion of conductive line 262 that is within an area from reference line $Y_1$ to reference line $Y_2$. Reference voltage line segment 264a is a portion of conductive line 264 that is within an area from reference line $Y_1$ to reference line $Y_2$. ROM cell 210-11 also includes a portion of fin structure 232 within an area from reference line $Y_1$ to reference line $Y_2$.

In some embodiments, ROM cell 210-11 corresponds to ROM cell 110[i] in FIG. 1A, and Bit line segment 262a corresponds to bit line BL in FIG. 1A. In some embodiments, reference voltage line segment 264a corresponds to reference voltage nodes 116[i] and 124 and is configured to receive reference voltage VSS. Fin structures 232, first gate structure 222a, and contact structures 242 and 254 together correspond to pass device 112[i] (FIG. 1A). Fin structures 232, second gate structure 226a, and contact structure 254, and a counterpart contact structure (not shown) on an opposite side of second gate structure 226a together correspond to isolation device 122 (FIG. 1A).

First gate structure 222a corresponds to the gate terminal of transistor 112[i]. Contact structure 242 corresponds to drain terminal of transistor 112[i] and is electrically connected with bit line segment 262a through a corresponding via plug V1. Contact structure 254 corresponds to source terminal of transistor 112[i] and is electrically connected with reference voltage line segment 264a through a corresponding via plug V1_Coding to store a logic low value.

Second gate structure 226a corresponds to the gate terminal of transistor 122 and is electrically connected with reference voltage line segment 264a through a corresponding via plug V1 and a corresponding gate contact structure GC to turn off transistor 122. Contact structure 254 corresponds to the first drain/source terminal of transistor 122. The counterpart contact structure (not shown) on the opposite side of second gate structure 226a corresponds to the second drain/source terminal of transistor 122.

First word line strapping line segment 274a extends along reference line $X_2$ and is electrically connected with first gate structure 222a through a via plug V1-1 and a gate contact structure GC-1. Second word line strapping line segment 272a extends along reference line $X_1$ and is free from being electrically connected with first gate structure 222a within the cell boundaries of ROM cell 210-11.

ROM cell 210-12 includes a first gate structure 224a, a second gate structure 228a, a first word line strapping line segment 274b, a second word line strapping line segment 272b, a bit line segment 262b, and a reference voltage line segment 264b. First gate structure 224a is a portion of gate strip 224 that is within an area from reference line $X_1$ to reference line $X_2$. Second gate structure 228a is a portion of gate strip 228 that is within an area from reference line $X_1$ to reference line $X_2$. First word line strapping line segment 274b is a portion of conductive line 274 that is within an area from reference line $Y_2$ to reference line $Y_3$. Second word line strapping line segment 272b is a portion of conductive line 272 that is within an area from reference line $Y_2$ to reference line $Y_3$. Bit line segment 262b is a portion of conductive line 262 that is within an area from reference line $Y_2$ to reference line $Y_3$. Reference voltage line segment 264b is a portion of conductive line 264 that is within an area from reference line $Y_2$ to reference line $Y_3$. ROM cell 210-12 also includes a portion of fin structure 232 within an area from reference line $Y_2$ to reference line $Y_3$.

First gate structure 224a, second gate structure 228a, first word line strapping line segment 274b, second word line strapping line segment 272b, bit line segment 262b, and reference voltage line segment 264b of ROM cell 210-12 correspond to first gate structure 222a, second gate structure 224a, first word line strapping line segment 274a, second word line strapping line segment 272a, bit line segment 262a, and reference voltage line segment 264a of ROM cell 210-11, and detailed description thereof is thus omitted. Contact structure 242 corresponds to a drain terminal of the pass device of ROM cell 210-12. Contact structure 252 corresponds to a source terminal of the pass device of ROM cell 210-12 and a drain/source terminal of isolation device of ROM cell 210-12.

Word line strapping line segment 274a and word line strapping line segment 274b are connected with each other at the first interconnection layer of the ROM circuit 200. Word line strapping line segment 272a and word line strapping line segment 272b are connected with each other at the first interconnection layer of the ROM circuit 200.

Bit line segment 262a and the bit line segment 262b are connected with each other at the first interconnection layer of the ROM circuit 200. Reference voltage line segment 264a and the reference voltage line segment 264b are connected with each other at the first interconnection layer of the ROM circuit 200.

Compared with ROM cell 210-11, first word line strapping line segment 274b is free from being electrically connected with first gate structure 224a within the cell boundaries of ROM cell 210-12. Also, second word line strapping line segment 272b is electrically connected with first gate structure 224a through a via plug V1-2 and a gate contact structure GC-2.

ROM cell 210-21 includes a first gate structure 222b, a second gate structure 226b, a first word line strapping line segment 276a, a second word line strapping line segment 274a, a bit line segment 266a, and a reference voltage line segment 268a. First gate structure 222b is a portion of gate strip 222 that is within an area from reference line $X_2$ to reference line $X_3$. Second gate structure 226b is a portion of gate strip 226 that is within an area from reference line $X_2$ to reference line $X_3$. Gate structures 222a and 222b are connected with each other. Gate structures 224a and 224b are connected with each other.

First word line strapping line segment 276a is a portion of conductive line 276 that is within an area from reference line Y$_1$ to reference line Y$_2$. Second word line strapping line segment 274a is the same contact structure used as first word line strapping line segment 274a of ROM cell 210-11. Bit line segment 266a is a portion of conductive line 266 that is within an area from reference line Y$_1$ to reference line Y$_2$. Reference voltage line segment 268a is a portion of conductive line 268 that is within an area from reference line Y$_1$ to reference line Y$_2$. ROM cell 210-21 also includes a portion of fin structure 234 within an area from reference line Y$_1$ to reference line Y$_2$.

First gate structure 222b, second gate structure 226b, first word line strapping line segment 276a, second word line strapping line segment 274a, bit line segment 266a, and reference voltage line segment 268a of ROM cell 210-21 correspond to first gate structure 222a, second gate structure 224a, first word line strapping line segment 274a, second word line strapping line segment 272a, bit line segment 262a, and reference voltage line segment 264a of ROM cell 210-11, and detailed description thereof is thus omitted. Contact structure 244 corresponds to a drain terminal of the pass device of ROM cell 210-21. Contact structure 258 corresponds to a source terminal of the pass device of ROM cell 210-21 and a drain/source terminal of isolation device of ROM cell 210-21.

Compared with ROM cell 210-11, first word line strapping line segment 276a is free from being electrically connected with first gate structure 222b within the cell boundaries of ROM cell 210-21. Also, second word line strapping line segment 274a is electrically connected with first gate structure 222b through via plug V1-1 and gate contact structure GC-1. Contact structure 258 is not electrically connected with reference voltage line segment 268a to store a logic high value.

ROM cell 210-22 includes a first gate structure 224b, a second gate structure 228b, a first word line strapping line segment 276b, a second word line strapping line segment 274b, a bit line segment 266b, and a reference voltage line segment 268b. First gate structure 224b is a portion of gate strip 226 that is within an area from reference line X$_2$ to reference line X$_3$. Second gate structure 228b is a portion of gate strip 228 that is within an area from reference line X$_2$ to reference line X$_3$. Gate structures 226a and 226b are connected with each other. Gate structures 228a and 228b are connected with each other.

First word line strapping line segment 276b is a portion of conductive line 276 that is within an area from reference line Y$_2$ to reference line Y$_3$. Second word line strapping line segment 274b is a portion of conductive line 274 that is within an area from reference line Y$_2$ to reference line Y$_3$. Second word line strapping line segment 274b is the same contact structure used as first word line strapping line segment 274b of ROM cell 210-12. Bit line segment 266b is a portion of conductive line 266 that is within an area from reference line Y$_2$ to reference line Y$_3$. Reference voltage line segment 268b is a portion of conductive line 268 that is within an area from reference line Y$_2$ to reference line Y$_3$. ROM cell 210-22 also includes a portion of fin structure 234 within reference line Y$_2$ to reference line Y$_3$.

First gate structure 224b, second gate structure 228b, first word line strapping line segment 276b, second word line strapping line segment 274b, bit line segment 266b, and reference voltage line segment 268b of ROM cell 210-22 correspond to first gate structure 222a, second gate structure 224a, first word line strapping line segment 274a, second word line strapping line segment 272a, bit line segment 262a, and reference voltage line segment 264a of ROM cell 210-11, and detailed description thereof is thus omitted. Contact structure 244 corresponds to a drain terminal of the pass device of ROM cell 210-22. Contact structure 256 corresponds to a source terminal of the pass device of ROM cell 210-22 and a drain/source terminal of isolation device of ROM cell 210-22.

Word line strapping line segment 276a and word line strapping line segment 276b are connected with each other at the first interconnection layer of the ROM circuit 200. Bit line segment 266a and the bit line segment 266b are connected with each other at the first interconnection layer of the ROM circuit 200. Reference voltage line segment 268a and the reference voltage line segment 268b are connected with each other at the first interconnection layer of the ROM circuit 200.

Compared with ROM cell 210-11, first word line strapping line segment 276b is also electrically connected with first gate structure 224b through a via plug V1-3 and a gate contact structure GC-3. Second word line strapping line segment 274b is free from being electrically connected with first gate structure 224b within the cell boundaries of ROM cell 210-22.

Furthermore, fin structures 232 includes three fin structures extending along Y direction, and fin structures 234 includes three fin structures extending along Y direction. In some embodiments, fin structures 232 and fin structures 234 each have more or less than three fin structures. In some embodiments, fin structures 232 and fin structures 234 are manufactured by forming a plurality of parallel find structures than removing one or more fin structures that are within the gap region 236. In some embodiments, a width of gap region 236 is sufficient to accommodate word line strapping line segments and corresponding via plugs for forming a word line strapping structure. In such circumstances, inclusion of word line strapping structures as illustrated in FIG. 2A does not demand for additional area penalty for ROM circuit 200.

Figure 2B:
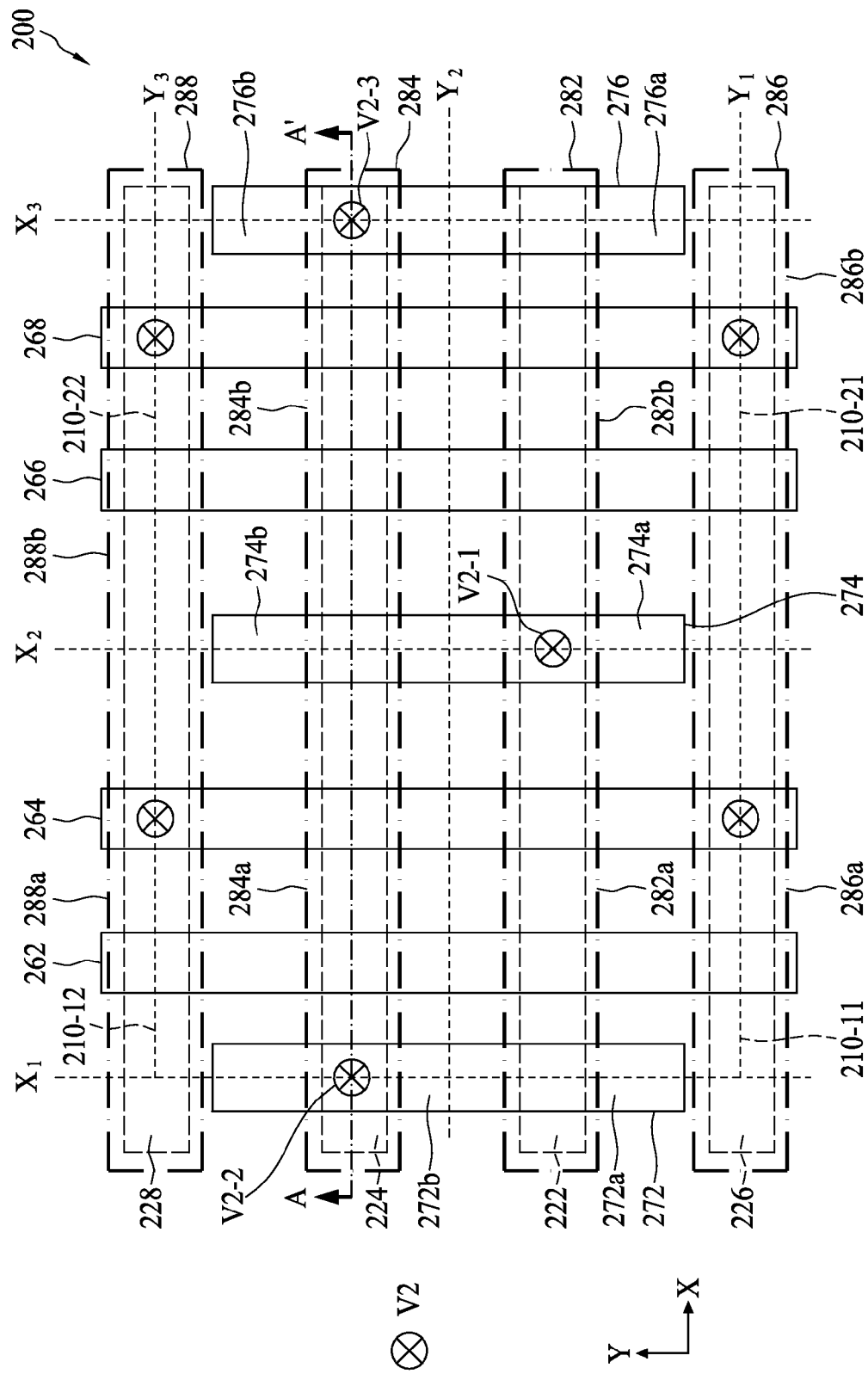
FIG. 2B is a top view of the four ROM cells of FIG. 2A, with the depictions regarding components from a first interconnection layer to the second interconnection layer of the ROM circuit, in accordance with some embodiments.

FIG. 2B is a top view of the four ROM cells 210-11, 210-12, 210-21, and 210-22 of FIG. 2A, with the depictions regarding components from the first interconnection layer to the second interconnection layer of the ROM circuit 200, in accordance with some embodiments. Components that are the same or similar to those in FIG. 2A are given the same reference numbers, and detailed description thereof is thus omitted.

ROM circuit 200 further includes conductive lines 282, 284, 286, and 288 extending along X direction. In some embodiments, conductive lines 282, 284, 286, and 288 are in the second interconnection layer of ROM circuit 200. ROM circuit 200 also includes various via plugs at a second via plug layer (labeled as V2) disposed to electrically connecting various conductive lines between the first interconnection layer and the second interconnection layer of ROM circuit 200.

ROM cell 210-11 includes a word line segment 282a and a reference voltage line segment 286a. Word line segment 282a is a portion of conductive line 282 that is within an area from reference line X$_1$ to reference line X$_2$. Reference voltage line segment 286a is a portion of conductive line 286 that is within an area from reference line X$_1$ to reference line X$_2$. Word line segment 282a corresponds to word line WL[i] in FIG. 1A. Reference voltage line segment 286a corresponds to reference voltage nodes 116[i] and 124 and is configured to receive reference voltage VSS.

Word line segment 282a is electrically connected with first word line strapping line segment 274a through a via plug V2-1 and is free from being electrically connected with second word line strapping line segment 272a within the cell boundaries of ROM cell 210-11. Reference voltage line segment 286a is electrically connected with conductive line 264 through a corresponding via plug V2.

ROM cell 210-12 includes a word line segment 284a and a reference voltage line segment 288a. Word line segment 284a is a portion of conductive line 284 that is within an area from reference line $X_1$ to reference line $X_2$. Reference voltage line segment 288a is a portion of conductive line 288 that is within an area from reference line $X_1$ to reference line $X_2$. Word line segment 284a and reference voltage line segment 288a correspond to word line segment 282a and reference voltage line segment 286a of ROM cell 210-11, and detailed description thereof is thus omitted.

Compared with ROM cell 210-11, word line segment 284a is electrically connected with second word line strapping line segment 272b through a via plug V2-2 and is not electrically connected with first word line strapping line segment 274b within the cell boundaries of ROM cell 210-12. Reference voltage line segment 288a is electrically connected with conductive line 264 through a corresponding via plug V2.

ROM cell 210-21 includes a word line segment 282b and a reference voltage line segment 286b. Word line segment 282b is a portion of conductive line 282 that is within an area from reference line $X_2$ to reference line $X_3$. Reference voltage line segment 286b is a portion of conductive line 286 that is within an area from reference line $X_2$ to reference line $X_3$. Word line segments 282a and 282b are connected with each other at the second interconnection layer of ROM circuit 200. Reference voltage line segments 286a and 286b are connected with each other at the second interconnection layer of ROM circuit 200. Word line segment 282b and reference voltage line segment 284b correspond to word line segment 282a and reference voltage line segment 286a of ROM cell 210-11, and detailed description thereof is thus omitted.

Compared with ROM cell 210-11, word line segment 282b is electrically connected with second word line strapping line segment 274a through via plug V2-1, which is the same word line strapping line segment configured as first word line strapping line segment 274a of ROM cell 210-11. Also, word line segment 282b is free from being electrically connected with first word line strapping line segment 276a within the cell boundaries of ROM cell 210-21. Reference voltage line segment 286b is electrically connected with conductive line 268 through a corresponding via plug V2.

ROM cell 210-22 includes a word line segment 284b and a reference voltage line segment 288b. Word line segment 284b is a portion of conductive line 284 that is within an area from reference line $X_2$ to reference line $X_3$. Reference voltage line segment 288b is a portion of conductive line 288 that is within an area from reference line $X_2$ to reference line $X_3$. Word line segments 284a and 284b are connected with each other at the second interconnection layer of ROM circuit 200. Reference voltage line segments 288a and 288b are connected with each other at the second interconnection layer of ROM circuit 200. Word line segment 284b and reference voltage line segment 288b correspond to word line segment 282a and reference voltage line segment 286a of ROM cell 210-11, and detailed description thereof is thus omitted.

Compared with ROM cell 210-11, word line segment 284b is electrically connected with first word line strapping line segment 276b through a via plug V2-3 and is free from being electrically connected with second word line strapping line segment 274b within the cell boundaries of ROM cell 210-22. Second word line strapping line segment 274b is configured as first word line strapping line segment 274b of ROM cell 210-12. Reference voltage line segment 288b is electrically connected with conductive line 268 through a corresponding via plug V2.

Figure 3:
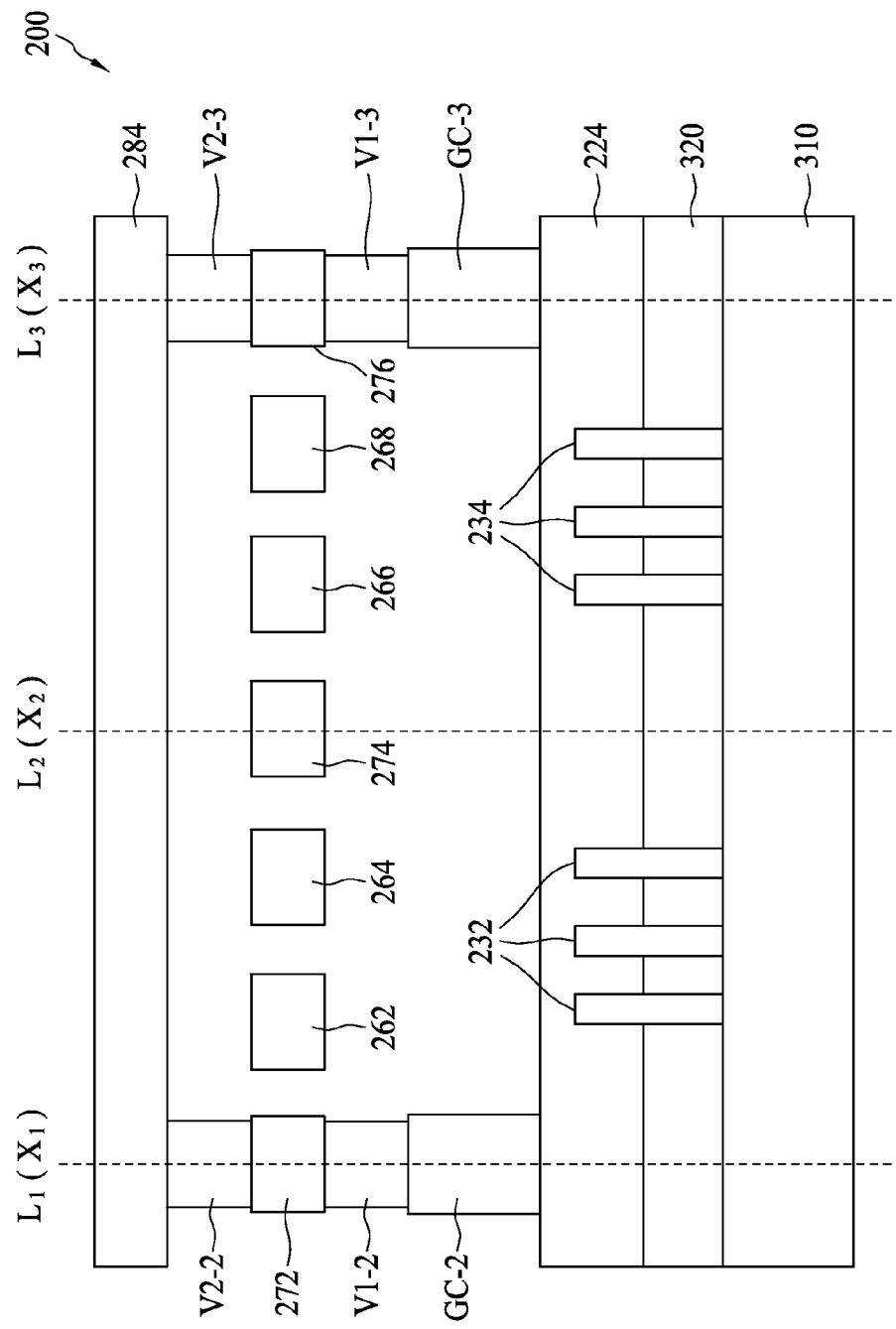
FIG. 3 is a cross-sectional view of the ROM circuit of FIGS. 2A and 2B taken from reference line A-A', in accordance with some embodiments.

FIG. 3 is a cross-sectional view of ROM circuit 200 of FIGS. 2A and 2B taken from reference line A-A' in accordance with some embodiments. Components in FIG. 3 that are the same or similar to those in FIGS. 2A and 2B are given the same reference numbers, and detailed description thereof is thus omitted. Reference line $L_1$ corresponds to the position where reference line $X_1$ intersects reference line A-A'. Reference line $L_2$ corresponds to the position where reference line $X_2$ intersects reference line A-A'. Reference line $L_3$ corresponds to the position where reference line $X_3$ intersects reference line A-A'.

ROM circuit 200 includes a substrate 310, a plurality of fin structures 232 and 234 over substrate 310, an isolation layer 320 over substrate 310 and surrounding fin structures 232 and 234, and a gate strip 224 over isolation layer 320 and fin structures 232 and 234. ROM circuit 200 also includes gate contact structures GC-2 and GC-3 over gate strip 224, via plugs V1-2 and V1-3 at a first via layer of ROM circuit 200 and over gate contact structures GC-2 and GC-3, conductive lines 262, 264, 266, 268, 272, 274, and 276 at a first interconnection layer of ROM circuit 200 and over the first via layer, via plugs V2-2 and V2-3 at a second via layer of ROM circuit 200 and over the first interconnection layer, and conductive line 284 at a second interconnection layer of ROM circuit 200 and over the second via layer.

Conductive line 284 is electrically coupled with gate strip 224 through via plug V2-2, conductive line 272, via plug V1-2, and gate contact structure GC-2 stacked along reference line $L_1$. Conductive line 284 is also electrically coupled with gate strip 224 through via plug V2-3, conductive line 276, via plug V1-3, and gate contact structure GC-3 stacked along reference line L3.

In some embodiments, substrate 310 includes: an elementary semiconductor such as silicon or germanium in crystal, polycrystalline, or an amorphous structure; a compound semiconductor including silicon carbide, gallium arsenide, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, substrate 310 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some embodiments, substrate 310 is a semiconductor on insulator. In some examples, substrate 310 includes an epitaxial layer or a buried layer. In other examples, substrate 310 has a multilayer structure, or substrate 310 includes a multilayer compound semiconductor structure.

In some embodiments, gate strips 222, 224, 226, and 228 are polysilicon gate structures or metal gate structures. In some embodiments, fin structures 232 and 234 are doped semiconductor materials usable as active regions or various transistors of ROM circuit 200. In some embodiments, contact structures 242, 244, 252, 254, 256, and 258 include a material such as polysilicon, silicide, or metal.

In some embodiments, via plugs V1, V1_Coding, or V2 has a material includes aluminum, copper, tungsten, a combination thereof, or other suitable materials. In some embodiments, gate contact structures GC has a material includes polysilicon, silicide, aluminum, copper, tungsten, a combination thereof, or other suitable materials. In some embodiments, conductive lines 262, 264, 266, 268, 272, 274, 276, and/or 284 has a material includes aluminum, copper, a combination thereof, or other suitable materials.

Figure 4:
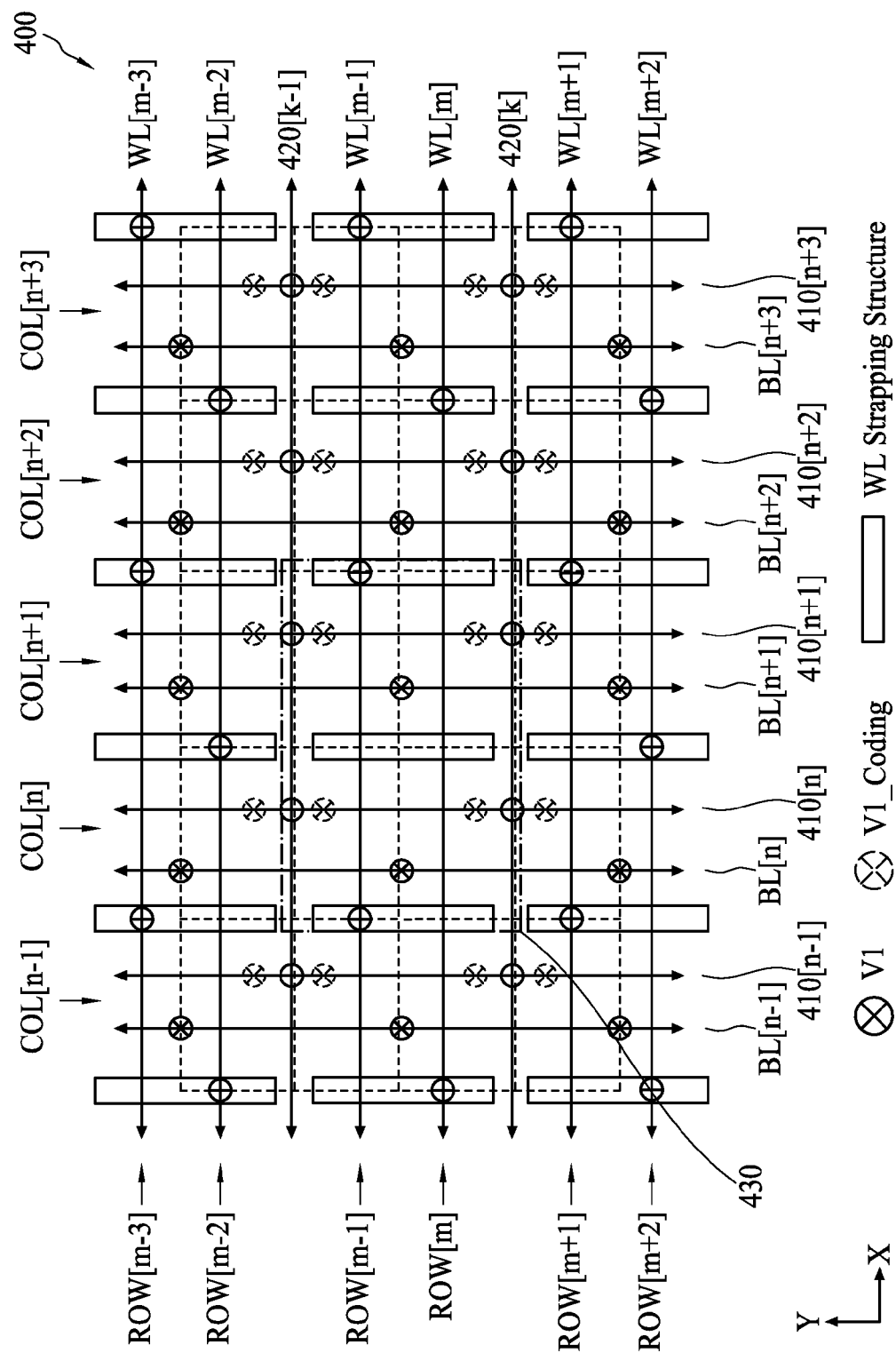
FIG. 4 is a routing diagram of a portion of a memory circuit implemented based on ROM cells of FIGS. 2A and 2B, in accordance with some embodiments.

FIG. 4 is a routing diagram of a portion of a memory circuit 400 implemented based on ROM cells 210-11, 210-12, 210-21- and 210-22 of FIGS. 2A and 2B in accordance with some embodiments.

Memory circuit 400 includes a plurality of ROM cells arranged into columns COL[n−1], COL[n], COL[n+1], COL [n+2], and COL[n+3] and rows ROW[m−3], ROW[m−2], ROW[m−1], ROW[m], ROW[m+1], and ROW[m+2]. Each ROM cell of memory circuit 400 has a configuration similar to one of ROM cells 210-11, 210-12, 210-21, and 210-22 depicted in FIGS. 2A and 2B. Memory circuit 400 further includes a plurality of bit lines BL[n−1], BL[n], BL[n+1], BL[n+2], and BL[n+2] extending along direction Y at a first interconnection layer of memory circuit 400, a plurality of word lines WL[m−3], WL[m−2], WL[m−1], WL[m], WL[m+1], and WL[m+2] extending along the X direction at a second interconnection layer of memory circuit 400, a first set of reference voltage lines 410[n−1], 410[n], 410[n+1], 410[n+2], and 410[n+2] extending along the Y direction at the first interconnection layer, and a second set of reference voltage lines 420[k] and 420[k−1] extending along the X direction at the second interconnection layer. Indices "m," "n," "k" are integers usable to identify individual components in FIG. 4.

Memory circuit 400 includes a plurality of word line strapping structures (depicted as rectangles in FIG. 4) corresponding to word line strapping segments of FIG. 2A and a plurality of via plugs V1 and V1_Coding corresponding to via plugs V1 and V1_Coding of FIG. 2A. Area 430 corresponds to ROM cells 210-11, 210-12, 210-21, and 210-22 of FIGS. 2A and 2B. Memory circuit 400 is implemented by an array of duplicates of area 430 with via plugs V1_Coding selectively placed to record data.

Compared with FIG. 2, word lines WL[m−3]~WL[m+2] also correspond to the position of the gate structures of pass devices of memory circuit 400, and reference voltage lines 420[k] and 420[k−1] also correspond to the position of the gate structures of isolation devices of memory circuit 400.

As depicted in FIG. 4, in each row ROW[m−3]~ROW [m+2], every two adjacent ROM cells shared one word line stripping structure that is electrically connected to the corresponding word line WL[m−3]~WL[m+2]. Also, each word line strapping structure does not extend beyond two corresponding, adjacent reference voltage lines 420[k] and 420[K−1]. In each column COL[n−1]~COL[n+3], every two adjacent ROM cells between two corresponding, adjacent reference voltage lines 420[k] and 420[K−1] has two word line strapping structures: one word line strapping structure for a corresponding one word line of the two adjacent ROM cells.

Memory circuit 200 and 400 illustrated in conjunction with FIGS. 2A-4 are based on memory circuit 100A of FIG. 1A. In some embodiments, memory circuit 200 and 400 are modified to implement memory circuit 100B of FIG. 1A. For example, for memory cell 210-11, contact structure 242 corresponds to the source terminal of transistor 132[i] and is electrically connected with conductive line 264 through a corresponding via plug V1 instead of conductive line 262; and contact structure 254 corresponds to the drain terminal of transistor 132[i] and is electrically connected with conductive line 262 through a corresponding via plug V1_Coding instead of conductive line 264. For implementing a memory circuit based on memory circuit 100B, ROM cells 210-12, 210-21, and 210-22 are modified in a manner similar to the modification for ROM cell 210-11 illustrated above.

Figure 5:
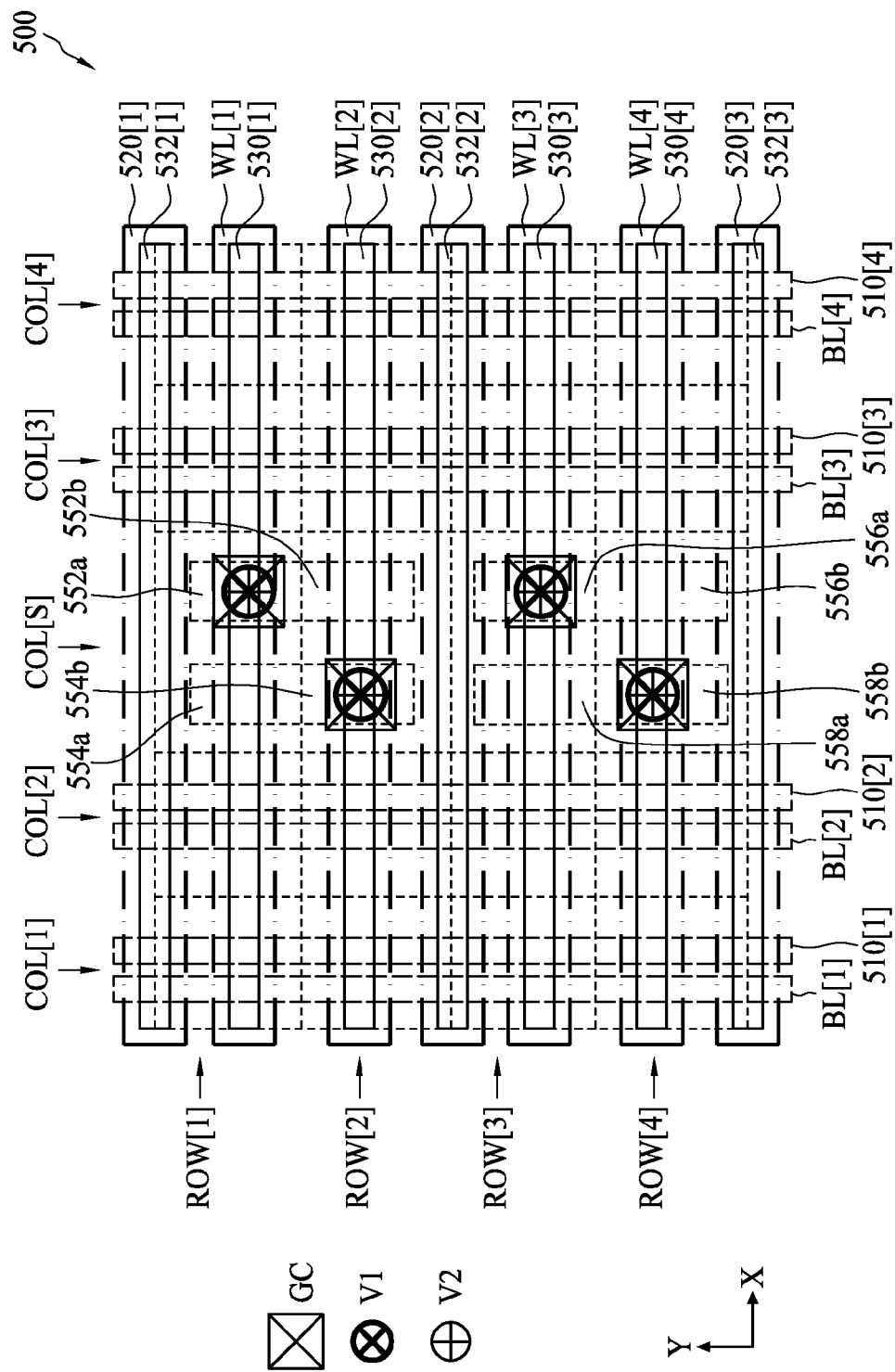
FIG. 5 is a top view of a plurality of ROM cells and four strapping cells of a ROM circuit based on ROM cells of FIG. 1A or FIG. 1B, with the depictions regarding some components of the ROM cells omitted, in accordance with some embodiments.

FIG. 5 is a top view of a plurality of ROM cells and four strapping cells of a ROM circuit 500 based on ROM cells of FIG. 1A or FIG. 1B, with the depictions regarding some components of the ROM cells omitted, in accordance with some embodiments. In some embodiments, ROM cells of FIG. 5 are different from ROM cells of FIG. 1A or FIG. 1B.

Memory circuit 500 includes a plurality of ROM cells arranged into columns COL[1], COL[2], COL[3], and COL [4] and rows ROW[1], ROW[2], ROW[3], and ROW[4]. Memory circuit 500 also includes a column of strapping cells COL[S]. In some embodiments, ROM cells memory circuit 500 are grouped into several memory arrays, where columns COL[1] and COL[2] belong to one of the memory arrays, and columns COL[3] and COL[4] belong to another one of the memory arrays. FIG. 5 depicts cell boundaries of various cells with fine, dotted lines.

Memory circuit 500 includes further includes bit lines BL[1], BL[2], BL[3], and BL[4] extending along direction Y at a first interconnection layer of memory circuit 500, a plurality of word lines WL[1], WL[1], WL[3], and WL[4] extending along the X direction at a second interconnection layer of memory circuit 500, a first set of reference voltage lines 510[1], 510[2], 510[3], and 510[4] extending along the Y direction at the first interconnection layer, and a second set of reference voltage lines 520[1], 520[2], and 520[3] extending along the X direction at the second interconnection layer. Memory circuit 500 also includes gate strips 530[1], 530[2], 530[3], and 530[4] corresponding to gate electrodes of pass devices of memory circuit 500 and gate strips 532[1], 532[2], and 532[3] corresponding to gate electrodes of isolation devices of memory circuit 500.

In some embodiments, each ROM cell has a configuration similar to one of ROM cells 210-11, 210-12, 210-21- and 210-22 illustrated in FIGS. 2A and 2B, and detailed description thereof is thus omitted. In some embodiments, each ROM cell has a configuration similar to one of ROM cells 210-11, 210-12, 210-21, and 210-22 illustrated in FIGS. 2A and 2B but free from having conductive lines 272, 274, and 276 and corresponding via plugs for forming word line strapping structures.

A strapping cell 542S (not labeled, positioned at row ROW[1] and column COL[S]) is between ROM cell 542L (not labeled, positioned at row ROW[1] and column COL [2]) and ROM cell 542R (not labeled, positioned at row ROW[1] and column COL[3]). Strapping cell 542S has a first gate structure that is a portion of gate strip 530[1] within the cell boundaries of strapping cell 542S. The first gate structure of strapping cell 542S is connected with a gate structure of a pass device of ROM cell 542L and a gate structure of a pass device of ROM cell 542R. Strapping cell 542S has a word line segment that is a portion of word line WL[1] within the cell boundaries of strapping cell 542S. The word line segment of strapping cell 542S is connected with a word line segment of ROM cell 542L and a word line segment of ROM cell 542R.

Strapping cell 542S has a first word line strapping line segment 552a at the first interconnection layer of ROM circuit 500 and a second word line strapping line segment 554a at the first interconnection layer of ROM circuit 500.

First word line strapping line segment 552a is connected with the first gate structure of strapping cell 542S through a corresponding gate contact structures GC and a corresponding via plug V1 at a first via layer. First word line strapping line segment 552a is connected with the word line segment of strapping cell 542S through a corresponding via plug V2 at a second via layer. Therefore, a portion of word line WL[1], i.e., the word line segment of strapping cell 542S, is electrically coupled with gate strip 530[1] within the cell boundaries of strapping cell 542S.

Another strapping cell 544S (not labeled, positioned at row ROW[2] and column COL[S]) is between ROM cell 544L (not labeled, positioned at row ROW[2] and column COL[2]) and ROM cell 544R (not labeled, positioned at row ROW[2] and column COL[3]). Strapping cell 544S has a first gate structure that is a portion of gate strip 530[2] within the cell boundaries of strapping cell 544S. The first gate structure of strapping cell 544S is connected with a gate structure of a pass device of ROM cell 544L and a gate structure of a pass device of ROM cell 544R. Strapping cell 544S has a word line segment that is a portion of word line WL[2] within the cell boundaries of strapping cell 544S. The word line segment of strapping cell 544S is connected with a word line segment of ROM cell 544L and a word line segment of ROM cell 544R.

Strapping cell 544S has a first word line strapping line segment 552b at the first interconnection layer of ROM circuit 500 and a second word line strapping line segment 554b at the first interconnection layer of ROM circuit 500. Word line strapping line segments 552a and 552b are connected with each other, and word line strapping line segments 554a and 554b are connected with each other. Second word line strapping line segment 554b is connected with the first gate structure of strapping cell 544S through a corresponding gate contact structures GC and a corresponding via plug V1 at the first via layer. First word line strapping line segment 554b is connected with the word line segment of strapping cell 544S through a corresponding via plug V2 at the second via layer. Therefore, a portion of word line WL[2], i.e., the word line segment of strapping cell 544S, is electrically coupled with gate strip 530[2] within the cell boundaries of strapping cell 544S.

Strapping cell 546S (not labeled, positioned at row ROW[3] and column COL[S]) has word line strapping line segments 556a and 558a corresponding to word line strapping line segments 552a and 554a of strapping cell 542S. Strapping cell 548S (not labeled, positioned at row ROW[4] and column COL[S]) has word line strapping line segments 556b and 558b corresponding to word line strapping line segments 552b and 554b of strapping cell 544S. Strapping cell 546S and strapping cell 548S has a configuration as a duplicate of strapping cell 542S and strapping cell 544S, and detailed description thereof is thus omitted. In some embodiments, strapping cell 546S and strapping cell 548S has a configuration as a mirrored configuration of strapping cell 542S and strapping cell 544S, where word line WL[3] is electrically coupled with gate strip 530[3] through word line strapping line segment 558a, and word line WL[4] is electrically coupled with gate strip 530[4] through word line strapping line segment 556b.

Figure 6:
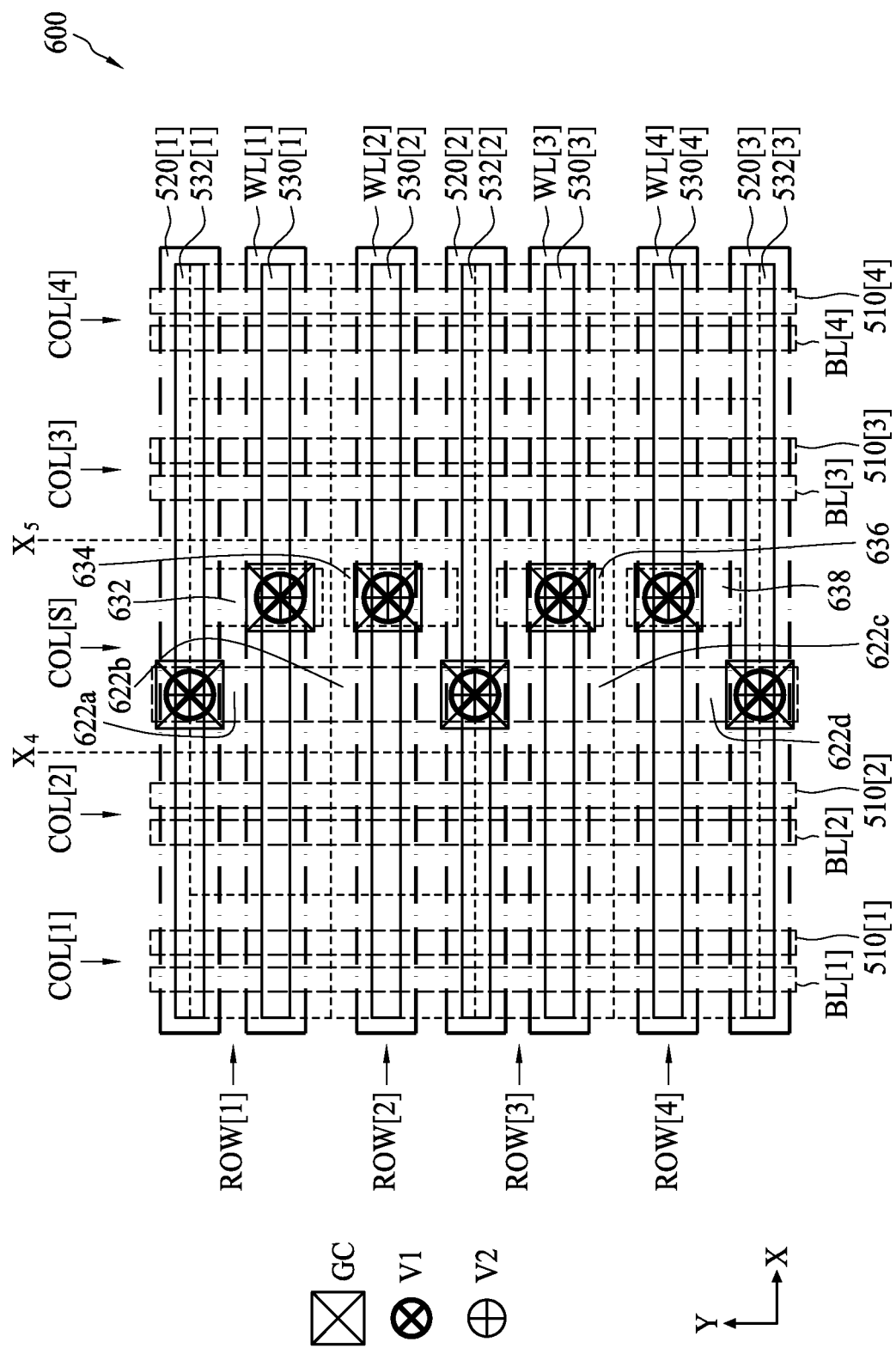
FIG. 6 is a top view of a plurality of ROM cells and four strapping cells of another ROM circuit based on ROM cells of FIG. 1A or FIG. 1B, with the depictions regarding some components of the ROM cells omitted, in accordance with some embodiments.

FIG. 6 is a top view of a plurality of ROM cells and four strapping cells of another ROM circuit 600 based on ROM cells of FIG. 1A or FIG. 1B, with the depictions regarding some components of the ROM cells omitted, in accordance with some embodiments. In some embodiments, ROM cells of FIG. 5 are different from ROM cells of FIG. 1A or FIG. 1B.

Components in FIG. 6 that are the same or similar to those in FIG. 5 are given the same reference numbers, and detailed description thereof is thus omitted. FIG. 6 also depicts cell boundaries of various cells with fine, dotted lines.

A strapping cell 612S (not labeled, positioned at row ROW[1] and column COL[S]) is between ROM cell 612L (not labeled, positioned at row ROW[1] and column COL[2]) and ROM cell 612R (not labeled, positioned at row ROW[1] and column COL[3]). The cell boundaries of strapping cell 612S includes a left boundary along a reference line $X_4$ and a right boundary along a reference line $X_5$. Strapping cell 612S has a first gate structure that is a portion of gate strip 530[1] within the cell boundaries of strapping cell 612S. The first gate structure of strapping cell 612S is connected with a gate structure of a pass device of ROM cell 612L and a gate structure of a pass device of ROM cell 612R. Strapping cell 612S has a second gate structure that is a portion of gate strip 532[1] within the reference line $X_4$ and the reference line $X_5$. The second gate structure of strapping cell 612S is connected with a gate structure of an isolation device of ROM cell 612L and a gate structure of an isolation device of ROM cell 612R. Strapping cell 612S has a word line segment that is a portion of word line WL[1] within the cell boundaries of strapping cell 612S. The word line segment of strapping cell 612S is connected with a word line segment of ROM cell 612L and a word line segment of ROM cell 612R.

Strapping cell 612S has an isolation gate strapping line segment 622a at the first interconnection layer of ROM circuit 600 and a word line strapping line segment 632 at the first interconnection layer of ROM circuit 600.

Word line strapping line segment 632 is connected with the first gate structure of strapping cell 612S through a corresponding gate contact structures GC and a corresponding via plug V1 at a first via layer. Word line strapping line segment 632 is also connected with the word line segment of strapping cell 612S through a corresponding via plug V2 at a second via layer. Therefore, a portion of word line WL[1], i.e., the word line segment of strapping cell 612S, is electrically coupled with gate strip 530[1] within the cell boundaries of strapping cell 612S.

Isolation gate strapping line segment 622a is connected with the second gate structure of strapping cell 612S through a corresponding gate contact structures GC and a corresponding via plug V1 at the first via layer. Isolation gate strapping line segment 622a is also connected with the reference line 520[1] through a corresponding via plug V2 at the second via layer.

Another strapping cell 614S (not labeled, positioned at row ROW[2] and column COL[S]) is between ROM cell 614L (not labeled, positioned at row ROW[2] and column COL[2]) and ROM cell 614R (not labeled, positioned at row ROW[2] and column COL[3]). Strapping cell 614S has a first gate structure that is a portion of gate strip 530[2] within the cell boundaries of strapping cell 544S. The first gate structure of strapping cell 544S is connected with a gate structure of a pass device of ROM cell 614L and a gate structure of a pass device of ROM cell 614R. Strapping cell 614S has a second gate structure that is a portion of gate strip 532[2] within the reference line $X_4$ and the reference line $X_5$. The second gate structure of strapping cell 614S is connected with a gate structure of an isolation device of ROM cell 614L and a gate structure of an isolation device of ROM cell 614R. Strapping cell 614S has an isolation gate strapping line segment 622b at the first interconnection layer of ROM circuit 600 and a word line strapping line segment 634 at the first interconnection layer of ROM circuit 600.

Word line strapping line segment 634 is connected with the first gate structure of strapping cell 614S through a corresponding gate contact structures GC and a corresponding via plug V1 at the first via layer. Word line strapping line segment 634 is also connected with the word line segment of strapping cell 614S through a corresponding via plug V2 at the second via layer. Therefore, a portion of word line WL[2], i.e., the word line segment of strapping cell 614S, is electrically coupled with gate strip 530[2] within the cell boundaries of strapping cell 614S.

Isolation gate strapping line segment 622b is connected with the second gate structure of strapping cell 614S through a corresponding gate contact structures GC and a corresponding via plug V1 at the first via layer. Isolation gate strapping line segment 622b is also connected with the reference line 520[2] through a corresponding via plug V2 at the second via layer. Isolation gate strapping line segment 622a and Isolation gate strapping line segment 622b are connected with each other.

Strapping cell 616S (not labeled, positioned at row ROW [3] and column COL[S]) has isolation gate strapping line segment 622c and word line strapping line segment 636 corresponding to isolation gate strapping line segment 622a and word line strapping line segment 632 of strapping cell 612S. Strapping cell 616S and strapping cell 614S shares the same isolation device. Isolation gate strapping line segment 622b and Isolation gate strapping line segment 622c are connected with each other. Strapping cell 618S (not labeled, positioned at row ROW[4] and column COL[S]) has isolation gate strapping line segment 622d and word line strapping line segment 638 corresponding to isolation gate strapping line segment 622b and word line strapping line segment 634 of strapping cell 614S. Isolation gate strapping line segment 622c and Isolation gate strapping line segment 622d are connected with each other. Strapping cell 616S and strapping cell 618S have a configuration as a duplicate of strapping cell 612S and strapping cell 614S, and detailed description thereof is thus omitted.

Figure 7:
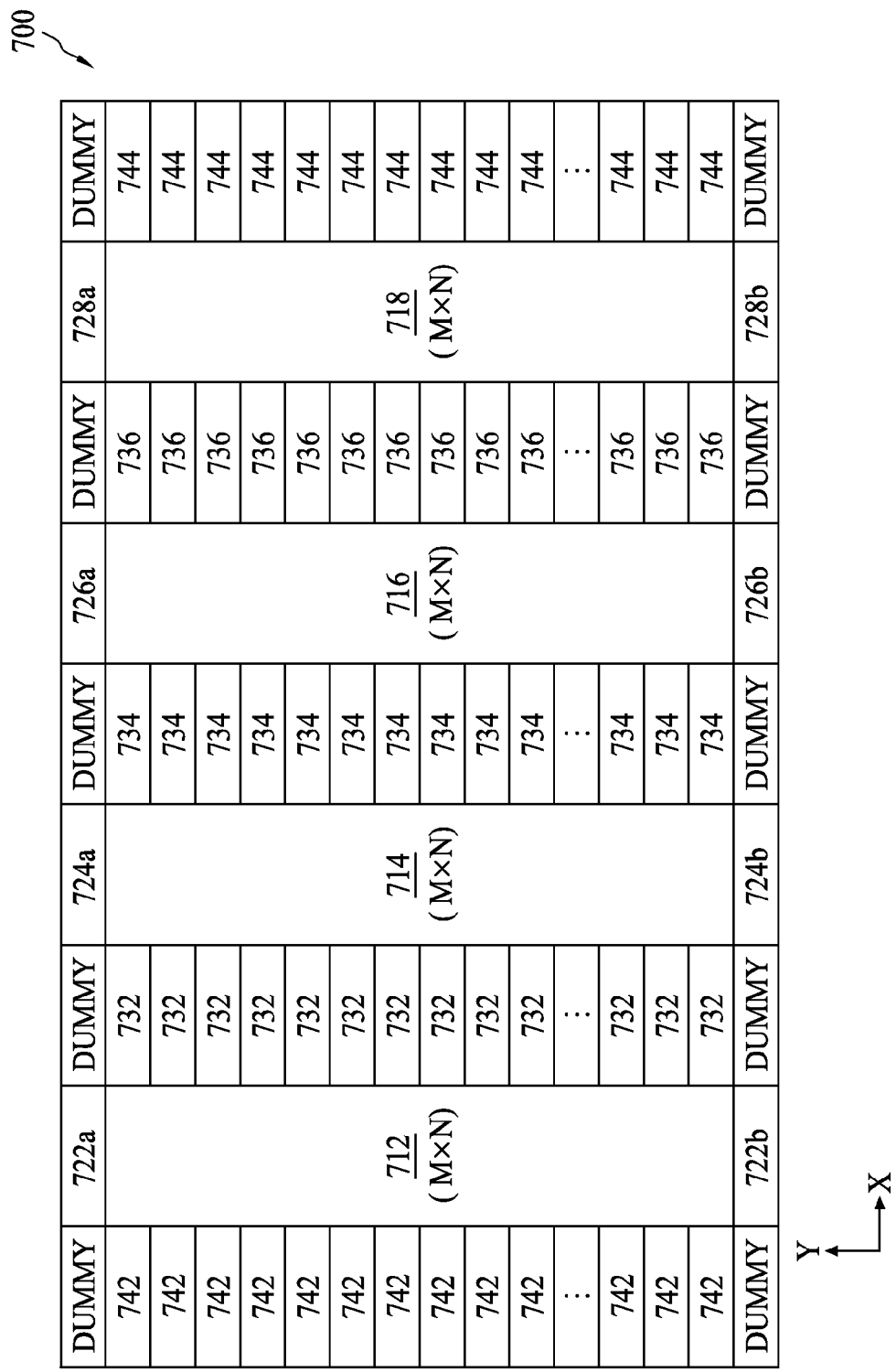
FIG. 7 is a routing diagram of a memory device having strapping cells of FIG. 5 and/or FIG. 6, in accordance with some embodiments.

FIG. 7 is a routing diagram of a memory device 700 having strapping cells of FIG. 5 and/or FIG. 6, in accordance with some embodiments.

Memory device 700 includes memory cell arrays 712, 714, 716, and 718 and column edge cells 722a, 722b, 724a, 724b, 726a, 726b, 728a, and 728b. Each memory cell array of memory cell arrays 712, 714, 716, and 718 has M columns and N rows of ROM cells. M and N are positive integers. In some embodiments, each ROM cell of memory cell arrays 712, 714, 716, and 718 has a configuration similar to one of ROM cells 210-11, 210-12, 210-21, and 210-22 illustrated in FIGS. 2A and 2B. In some embodiments, each memory cell of memory cell array 712, 714, 716, or 718 has a configuration similar to one of ROM cells 210-11, 210-12, 210-21, and 210-22 illustrated in FIGS. 2A and 2B with the omission of conductive lines 272, 274, and 276 and corresponding via plugs for forming word line strapping structures.

Memory cell array 712 is placed between column edge cells 722a and 722b along a column direction (e.g., the Y direction); memory cell array 714 is placed between column edge cells 724a and 724b along the Y direction; memory cell array 716 is placed between column edge cells 726a and 726b along the Y direction; and memory cell array 718 is placed between column edge cells 728a and 728b along the Y direction. Four memory cell arrays 712, 714, 716, and 718 are depicted as a non-limiting example. In some embodiments, memory device 700 includes more or less than four memory cell arrays.

Memory device 700 further includes dummy cell regions (identified as "DUMMY" in FIG. 7) and columns of strapping cells 732, 734, and 736 and two columns of edge strapping cells 742 and 744 between various dummy cell regions. Memory cell array 712 is placed between edge strapping cells 742 and strapping cells 732 along a row direction (e.g., the X direction); memory cell arrays 714 is placed between a column of strapping cells 732 and a column of strapping cells 734 along the Y direction; memory cell arrays 716 is placed between a column of strapping cells 734 and a column of strapping cells 736 along the Y direction; and memory cell arrays 718 is placed between a column of strapping cells 736 and a column of edge strapping cells 744 along the Y direction.

In some embodiments, memory device 700 includes a plurality of gate strip and word lines extending along the X direction throughout at least memory cell arrays 712, 714, 716, and 718 and the columns of strapping cells 732, 734, and 736.

In some embodiments, the columns of strapping cells 732, 734, and 736 have a configuration similar to the column of strapping cells 542S, 544S, 546S, and 548S of FIG. 5. In some embodiments, two adjacent strapping cells of the columns of strapping cells 734 corresponding to strapping cells 542S and 544S are separated from two adjacent strapping cells of the columns of strapping cells 732 corresponding to strapping cells 542S and 544S by two rows of ROM cells of memory array 714 and from two adjacent strapping cells of the columns of strapping cells 736 corresponding to strapping cells 542S and 544S by two rows of ROM cells of memory array 716.

In some embodiments, the columns of strapping cells 732, 734, and 736 have a configuration similar to the column of strapping cells 612S, 614S, 616S, and 618S of FIG. 6. In some embodiments, two adjacent strapping cells of the columns of strapping cells 734 corresponding to strapping cells 612S and 614S are separated from two adjacent strapping cells of the columns of strapping cells 732 corresponding to strapping cells 612S and 614S by two rows of ROM cells of memory array 714 and from two adjacent strapping cells of the columns of strapping cells 736 corresponding to strapping cells 612S and 614S by two rows of ROM cells of memory array 716.

In some embodiments, at least one column of the columns of strapping cells 732, 734, and 736 has a configuration similar to the column of strapping cells depicted in FIG. 5, and, at least another one column of the columns of strapping cells 732, 734, and 736 has a configuration similar to the column of strapping cells depicted in FIG. 6.

For example, in some embodiments, the column of strapping cells 734 has a configuration similar to the column of strapping cells 612S, 614S, 616S, and 618S of FIG. 6; and the columns of strapping cells 732 and 736 have a configuration similar to the column of strapping cells 542S, 544S, 546S, and 548S of FIG. 5. In some embodiments, two adjacent strapping cells of the columns of strapping cells 734 corresponding to strapping cells 612S and 614S are separated from two adjacent strapping cells of the columns of strapping cells 732 corresponding to strapping cells 542S and 544S by two rows of ROM cells of memory array 714 and from two adjacent strapping cells of the columns of strapping cells 736 corresponding to strapping cells 542S and 544S by two rows of ROM cells of memory array 716.

In some embodiments, the columns of strapping cells edge strapping cells 742 and 744 are edge well strapping cells. Edge well strapping cells include conductive structures configured to receive one or more biasing voltages and apply the one or more biasing voltage to one or more corresponding well regions used to form the transistors of Memory device 700. In some embodiments, the columns of strapping cells edge strapping cells 742 and 744 are combined edge strapping cells, and each one of the combined edge strapping cells includes an edge well strapping cell and a strapping cell depicted in FIG. 6.

In accordance with one embodiment, a memory circuit includes a first memory cell and a second memory adjacent to the first memory cell. The first memory cell includes a pass device; a word line segment; a first word line strapping line segment electrically coupled with the pass device of the first memory cell and the word line segment of the first memory cell; and a second word line strapping line segment. The second memory cell includes a pass device; a word line segment; a first word line strapping line segment; and a second word line strapping line segment electrically coupled with the pass device of the second memory cell and the word line segment of the second memory cell. The first word line strapping line segment of the first memory cell and the first word line strapping line segment of the second memory cell are connected with each other at a first interconnection layer of the memory circuit. The second word line strapping line segment of the first memory cell and the second word line strapping line segment of the second memory cell are connected with each other at the first interconnection layer of the memory circuit.

In accordance with another embodiment, a memory circuit includes a first memory cell, a second memory cell adjacent to the first memory cell, a third memory cell, a fourth memory cell adjacent to the third memory cell, a first strapping cell between the first memory cell and the third memory cell, and a second strapping cell between the second memory cell and the fourth memory cell. The first memory cell includes a pass device and a word line segment. The second memory cell includes a pass device and a word line segment. The third memory cell includes a pass device and a word line segment. The fourth memory cell includes a pass device and a word line segment. The first strapping cell includes a first gate structure connecting a gate structure of the pass device of the first memory cell and a gate structure of the pass device of the third memory cell; a word line segment connecting the word line segment of the first memory cell and the word line segment of the third memory cell; a first word line strapping line segment electrically coupled with the first gate structure of the first strapping cell and the word line segment of the first strapping cell; and a second word line strapping line segment. The second strapping cell includes a first gate structure connecting a gate structure of the pass device of the second memory cell and a gate structure of the pass device of the fourth memory cell; a word line segment connecting the word line segment of the second memory cell and the word line segment of the fourth memory cell; a first word line strapping line segment; and a second word line strapping line segment electrically coupled with the first gate structure of the second strapping cell and the word line segment of the second strapping cell. The first word line strapping line segment of the first strapping cell and the first word line strapping line segment of the second strapping cell are connected with each other at a first interconnection layer of the memory circuit. The second word line strapping line segment of the first strapping cell and the second word line strapping line segment of the second strapping cell are connected with each other at the first interconnection layer of the memory circuit.

In accordance with another embodiment, a memory circuit includes a memory circuit includes a first memory cell, a second memory cell adjacent to the first memory cell, a third memory cell, a fourth memory cell adjacent to the third memory cell, a first strapping cell between the first memory cell and the third memory cell, and a second strapping cell between the second memory cell and the fourth memory cell. The first memory cell includes a pass device; an isolation device; and a word line segment. The second memory cell includes a pass device; an isolation device; and a word line segment. The third memory cell includes a pass device; an isolation device; and a word line segment. The fourth memory cell includes a pass device; an isolation device; and a word line segment. The first strapping cell includes a first gate structure connecting a gate of the pass device of the first memory cell and a gate of the pass device of the third memory cell; a second gate structure connecting a gate of the isolation device of the first memory cell and a gate of the isolation device of the third memory cell; a word line segment connecting the word line segment of the first memory cell and the word line segment of the third memory cell; a word line strapping line segment electrically coupled with the first gate structure of the first strapping cell and the word line segment of the first strapping cell; and an isolation gate strapping line segment electrically coupled with the second gate structure of the first strapping cell. The second strapping cell includes a first gate structure connecting a gate of the pass device of the second memory cell and a gate of the pass device of the fourth memory cell; a second gate structure connecting a gate of the isolation device of the second memory cell and a gate of the isolation device of the fourth memory cell; a word line segment connecting the word line segment of the second memory cell and the word line segment of the fourth memory cell; a word line strapping line segment electrically coupled with the first gate structure of the second strapping cell and the word line segment of the second strapping cell; and an isolation gate strapping line segment electrically coupled with the second gate structure of the second strapping cell. The isolation gate strapping line segment of the first strapping cell and the isolation gate strapping line segment of the first strapping cell are connected with each other at a first interconnection layer of the memory circuit. The word line strapping line segment of the first strapping cell is at the first interconnection layer of the memory circuit. The word line strapping line segment of the second strapping cell is at the first interconnection layer of the memory circuit.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic value of various signals used in the above description is also for illustration. Various embodiments are not limited to a particular logic value when a signal is activated and/or deactivated. Selecting different logic values is within the scope of various embodiments. In various embodiments, a source terminal of a transistor can be configured as a drain terminal, and a drain terminal can be configured as a source terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
   a first memory cell, comprising:
      a pass device;
      a word line segment;
      a first word line strapping line segment electrically coupled with the pass device of the first memory cell and the word line segment of the first memory cell, a first lengthwise axis of the word line segment of the first memory cell and a second lengthwise axis of the first word line strapping line segment of the first memory cell extending in perpendicular directions; and
      a second word line strapping line segment; and
   a second memory cell adjacent to the first memory cell, the second memory cell comprising:
      a pass device;
      a word line segment;
      a first word line strapping line segment; and
      a second word line strapping line segment electrically coupled with the pass device of the second memory cell and the word line segment of the second memory cell, a third lengthwise axis of the word line segment of the second memory cell and a fourth lengthwise axis of the second word line strapping line segment of the second memory cell extending in perpendicular directions,
   wherein
      the first word line strapping line segment of the first memory cell and the first word line strapping line segment of the second memory cell are connected with each other at a first interconnection layer of the memory circuit; and
      the second word line strapping line segment of the first memory cell and the second word line strapping line segment of the second memory cell are connected with each other at the first interconnection layer of the memory circuit.

2. The memory circuit of claim 1, wherein
   the word line segment of the first memory cell and the word line segment of the second memory cell are at a second interconnection layer of the memory circuit over the first interconnection layer of the memory circuit.

3. The memory circuit of claim 1, wherein
   the first memory cell further comprises:
      a bit line segment;
   the second memory cell further comprises:
      a bit line segment; and
   the bit line segment of the first memory cell and the bit line segment of the second memory cell are connected with each other at the first interconnection layer of the memory circuit.

4. The memory circuit of claim 3, wherein
   the first memory cell further comprises:
      a contact structure electrically coupled with a drain terminal of the pass device of the first memory cell and the bit line segment of the first memory cell;
   the second memory cell further comprises:
      a contact structure electrically coupled with a drain terminal of the pass device of the second memory cell and the bit line segment of the first memory cell; and
   the contact structure of the first memory cell and the contact structure of the second memory cell are the same contact structure.

5. The memory circuit of claim 1, further comprising:
   a third memory cell adjacent to the first memory cell, the third memory cell comprising:
      a pass device;
      a word line segment electrically coupled with the word line segment of the first memory cell;
      a first word line strapping line segment, the first word line strapping line segment of the third memory cell and the second word line strapping line segment of the first memory cell being the same line segment; and
      a second word line strapping line segment electrically coupled with the pass device of the third memory cell and the word line segment of the third memory cell; and
   a fourth memory cell adjacent to the third memory cell and the second memory cell, the fourth memory cell comprising:
      a pass device;
      a word line segment electrically coupled with the word line segment of the second memory cell;
      a first word line strapping line segment electrically coupled with the pass device of the fourth memory cell and the word line segment of the fourth memory cell, the first word line strapping line segment of the fourth memory cell and the second word line strapping line segment of the second memory cell being the same line segment; and
      a second word line strapping line segment,
   wherein
      the second word line strapping line segment of the third memory cell and the second word line strapping line segment of the fourth memory cell are connected with each other at the first interconnection layer of the memory circuit.

6. The memory circuit of claim 5, wherein
   the pass device of the first memory cell comprises:
      a gate structure;
   the pass device of the second memory cell comprises:
      a gate structure;
   the pass device of the third memory cell comprises:
      a gate structure;
   the pass device of the fourth memory cell comprises:
      a gate structure;
   the gate structure of the pass device of the first memory cell is connected with the gate structure of the pass device of the third memory cell; and
   the gate structure of the pass device of the second memory cell is connected with the gate structure of the pass device of the fourth memory cell.

7. The memory circuit of claim 5, wherein
   the first memory cell further comprises:
      an isolation device having a gate structure;
   the third memory cell further comprises:
      an isolation device having a gate structure;
   the second memory cell further comprises:
      an isolation device having a gate structure;
   the fourth memory cell further comprises:
      an isolation device having a gate structure;

the gate structure of the isolation device of the first memory cell is connected with the gate structure of the isolation device of the third memory cell; and the gate structure of the isolation device of the second memory cell is connected with the gate structure of the isolation device of the fourth memory cell.

8. The memory circuit of claim 5, wherein the word line segment of the first memory cell and the word line segment of the third memory cell are connected at a second interconnection layer of the memory circuit over the first interconnection layer of the memory circuit; and the word line segment of the second memory cell and the word line segment of the fourth memory cell are connected at the second interconnection layer of the memory circuit.

9. A memory circuit, comprising:
a first memory cell, the first memory cell comprising:
  a pass device;
  an isolation device; and
  a word line segment;
a second memory cell adjacent to the first memory cell, the second memory cell comprising:
  a pass device;
  an isolation device; and
  a word line segment;
a third memory cell, the third memory cell comprising:
  a pass device;
  an isolation device; and
  a word line segment;
a fourth memory cell adjacent to the third memory cell, the fourth memory cell comprising:
  a pass device;
  an isolation device; and
  a word line segment;
a first strapping cell between the first memory cell and the third memory cell, the first strapping cell comprising:
  a first gate structure connecting a gate of the pass device of the first memory cell and a gate of the pass device of the third memory cell;
  a second gate structure connecting a gate of the isolation device of the first memory cell and a gate of the isolation device of the third memory cell;
  a word line segment connecting the word line segment of the first memory cell and the word line segment of the third memory cell;
  a word line strapping line segment electrically coupled with the first gate structure of the first strapping cell and the word line segment of the first strapping cell; and
  an isolation gate strapping line segment electrically coupled with the second gate structure of the first strapping cell; and
a second strapping cell between the second memory cell and the fourth memory cell, the second strapping cell comprising:
  a first gate structure connecting a gate of the pass device of the second memory cell and a gate of the pass device of the fourth memory cell;
  a second gate structure connecting a gate of the isolation device of the second memory cell and a gate of the isolation device of the fourth memory cell;
  a word line segment connecting the word line segment of the second memory cell and the word line segment of the fourth memory cell;
  a word line strapping line segment electrically coupled with the first gate structure of the second strapping cell and the word line segment of the second strapping cell; and
  an isolation gate strapping line segment electrically coupled with the second gate structure of the second strapping cell, wherein the isolation gate strapping line segment of the first strapping cell and the isolation gate strapping line segment of the second strapping cell are connected with each other at a first interconnection layer of the memory circuit, the word line strapping line segment of the first strapping cell is at the first interconnection layer of the memory circuit; and the word line strapping line segment of the second strapping cell is at the first interconnection layer of the memory circuit.

10. The memory circuit of claim 9, wherein the word line segment of the first memory cell, the word line segment of the second memory cell, the word line segment of the third memory cell, the word line segment of the fourth memory cell, the word line segment of the first strapping cell, and the word line segment of the second strapping cell are at a second interconnection layer of the memory circuit over the first interconnection layer of the memory circuit.

11. The memory circuit of claim 9, further comprising:
a third strapping cell separated from the first strapping cell by at least the first memory cell or the third memory cell, the third strapping cell comprising:
  a first gate structure electrically coupled with the gate of the pass device of the first memory cell and the gate of the pass device of the third memory cell;
  a second gate structure electrically coupled with the gate of the isolation device of the first memory cell and the gate of the isolation device of the third memory cell;
  a word line segment electrically coupled with the word line segment of the first memory cell and the word line segment of the third memory cell;
  a word line strapping line segment electrically coupled with the first gate structure of the third strapping cell and the word line segment of the third strapping cell; and
  an isolation gate strapping line segment electrically coupled with the second gate structure of the third strapping cell; and
a fourth strapping cell separated from the second strapping cell by at least the second memory cell or the fourth memory cell, the fourth strapping cell comprising:
  a first gate structure electrically coupled with the gate of the pass device of the second memory cell and the gate of the pass device of the fourth memory cell;
  a second gate structure electrically coupled with the gate of the isolation device of the second memory cell and the gate of the isolation device of the fourth memory cell;
  a word line segment electrically coupled with the word line segment of the second memory cell and the word line segment of the fourth memory cell;
  a word line strapping line segment electrically coupled with the first gate structure of the fourth strapping cell and the word line segment of the fourth strapping cell; and an isolation gate strapping line segment electrically coupled with the second gate structure of the fourth strapping cell, wherein the isolation gate strapping line segment of the third strapping cell and the isolation gate strapping line segment of the fourth strapping cell are connected with each other at the first interconnection layer of the memory circuit;

the word line strapping line segment of the third strapping cell is at the first interconnection layer of the memory circuit; and the word line strapping line segment of the fourth strapping cell is at the first interconnection layer of the memory circuit.

12. The memory circuit of claim 11, wherein the third strapping cell is separated from the first strapping cell by a first plurality of memory cells, the first plurality of memory cells being continuously abutting one another;

the fourth strapping cell is separated from the second strapping cell by a second plurality of memory cells, the second plurality of memory cells being continuously abutting one another;

the first plurality of memory cells are free from having any word line strapping line segment at the first interconnection layer of the memory circuit; and the second plurality of memory cells are free from having any word line strapping line segment at the first interconnection layer of the memory circuit.

13. The memory circuit of claim 9, further comprising:

a fifth strapping cell separated from the first strapping cell by at least the first memory cell or the third memory cell, the fifth strapping cell comprising:

a gate structure electrically coupled with the gate of the pass device of the first memory cell and the gate of the pass device of the third memory cell;

a word line segment electrically coupled with the word line segment of the first memory cell and the word line segment of the third memory cell;

a first word line strapping line segment electrically coupled with the gate structure of the fifth strapping cell and the word line segment of the fifth strapping cell; and a second word line strapping line segment; and a sixth strapping cell separated from the second strapping cell by at least the second memory cell or the fourth memory cell, the sixth strapping cell comprising:

a gate structure electrically coupled with the gate of the pass device of the second memory cell and the gate of the pass device of the fourth memory cell;

a word line segment electrically coupled with the word line segment of the second memory cell and the word line segment of the fourth memory cell;

a first word line strapping line segment; and a second word line strapping line segment electrically coupled with the gate structure of the sixth strapping cell and the word line segment of the sixth strapping cell, wherein the first word line strapping line segment of the fifth strapping cell and the first word line strapping line segment of the sixth strapping cell are connected with each other at the first interconnection layer of the memory circuit; and the second word line strapping line segment of the fifth strapping cell and the second word line strapping line segment of the sixth strapping cell are connected with each other at the first interconnection layer of the memory circuit.

14. The memory circuit of claim 9, further comprising:

a seventh strapping cell adjacent to the second strapping cell, the seventh strapping cell comprising:

a word line strapping line segment; and an isolation gate strapping line segment connected with the isolation gate strapping line segment of the second strapping cell; and an eighth strapping cell adjacent to the seventh strapping cell, the eighth strapping cell comprising:

a word line strapping line segment; and an isolation gate strapping line segment connected with the isolation gate strapping line segment of the second strapping cell.

15. A memory array comprising:

a first memory cell comprising a first pass transistor;

a second memory cell adjacent the first memory cell and comprising a second pass transistor;

a first word line strapping line in a first metallization layer and electrically connecting a gate of the first pass transistor to a first word line, the first word line being disposed in a second metallization layer over the first metallization layer, and the first word line strapping line extending into the first memory cell and the second memory cell; and a second word line strapping line in the first metallization layer and electrically connecting a gate of the second pass transistor to a second word line different than the first word line, the second word line being disposed in the second metallization layer.

16. The memory array of claim 15, wherein the second word line strapping line extends into the first memory cell and the second memory cell.

17. The memory array of claim 15 further comprising a third memory cell comprising a third pass transistor, the second memory cell being disposed between the first memory cell and the third memory cell, the first memory cell, the second memory cell, and the third memory cell being disposed in a same column of the memory array, and the first word line strapping line not extending into the third memory cell.

18. The memory array of claim 15 further comprising a bit line in the first metallization layer and disposed between the first word line strapping line and the second word line strapping line.

19. The memory array of claim 15 further comprising a reference voltage line in the first metallization layer and disposed between the first word line strapping line and the second word line strapping line.

20. The memory array of claim 15 further comprising:

a via contacting the first word line strapping line and the first word line; and a gate contact contacting the first word line strapping line and the gate of the first pass transistor.

* * * * *